US010533896B2

(12) United States Patent
Obara et al.

(10) Patent No.: US 10,533,896 B2
(45) Date of Patent: Jan. 14, 2020

(54) HEAT TREATMENT APPARATUS AND TEMPERATURE CONTROL METHOD

(71) Applicant: TOKYO ELECTRON LIMITED, Tokyo (JP)

(72) Inventors: Kazuteru Obara, Oshu (JP); Koji Yoshii, Oshu (JP); Yuki Wada, Oshu (JP); Hitoshi Kikuchi, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 468 days.

(21) Appl. No.: 15/191,599

(22) Filed: Jun. 24, 2016

(65) Prior Publication Data

US 2016/0379897 A1 Dec. 29, 2016

(30) Foreign Application Priority Data

Jun. 29, 2015 (JP) .................. 2015-130165

(51) Int. Cl.
*G01J 5/00* (2006.01)
*C23C 16/52* (2006.01)
(Continued)

(52) U.S. Cl.
CPC .......... *G01J 5/0007* (2013.01); *C23C 16/402* (2013.01); *C23C 16/4584* (2013.01);
(Continued)

(58) Field of Classification Search
CPC ......... H01L 21/67248; H01L 21/68771; H01L 21/68764; C23C 16/46; C23C 16/52;
(Continued)

(56) References Cited

U.S. PATENT DOCUMENTS 6,191,399 B1 * 2/2001 Van Bilsen ............... G01J 5/00
118/725
7,577,493 B2 * 8/2009 Sugishita .................. G05B 5/01
219/411

(Continued)

FOREIGN PATENT DOCUMENTS

JP    H04-000713 A   1/1992
JP    H05190462 A    7/1993
(Continued)

*Primary Examiner* — Aiden Lee
(74) *Attorney, Agent, or Firm* — Nath, Goldberg & Meyer; Jerald L. Meyer

(57) ABSTRACT

There is provided a heat treatment apparatus for performing a predetermined film forming process on a substrate by mounting the substrate on a surface of a rotary table installed in a processing vessel and heating the substrate by a heating part while rotating the rotary table. The heat treatment apparatus includes: a first temperature measuring part of a contact-type configured to measure a temperature of the heating part; a second temperature measuring part of a non-contact type configured to measure a temperature of the substrate mounted on the rotary table in a state where the rotary table is being rotated; and a temperature control part configured to control the heating part based on a first measurement value measured by the first temperature measuring part and a second measurement value measured by the second temperature measuring part.

4 Claims, 9 Drawing Sheets

(51) Int. Cl.
*C23C 16/46* (2006.01)
*C23C 16/458* (2006.01)
*H01L 21/02* (2006.01)
*C23C 16/40* (2006.01)
*C23C 16/455* (2006.01)
*H01L 21/687* (2006.01)

(52) U.S. Cl.
CPC ........ *C23C 16/45551* (2013.01); *C23C 16/46* (2013.01); *C23C 16/52* (2013.01); *H01L 21/0228* (2013.01); *H01L 21/02164* (2013.01); *H01L 21/68764* (2013.01)

(58) Field of Classification Search
CPC ........... C23C 16/45551; C23C 16/4584; G01J 5/0007; G05D 23/1931
See application file for complete search history.

(56) References Cited

U.S. PATENT DOCUMENTS

| | | | |
|---|---|---|---|
| 2010/0055351 A1* | 3/2010 | Kato | ................. C23C 16/45521 427/595 |
| 2012/0303313 A1* | 11/2012 | Moroi | ............... C23C 16/45525 702/134 |

FOREIGN PATENT DOCUMENTS

| | | |
|---|---|---|
| JP | H09246261 A | 9/1997 |
| JP | 2003131745 A | 5/2003 |
| JP | 2003-257873 A | 9/2003 |
| JP | 2010-059494 A | 3/2010 |
| JP | 2010-59496 A | 3/2010 |
| JP | 2012248634 A | 12/2012 |
| KR | 2003-0014116 A | 2/2003 |
| KR | 10-2010-0028496 A | 3/2010 |
| KR | 10-2012-0132417 A | 12/2012 |

* cited by examiner

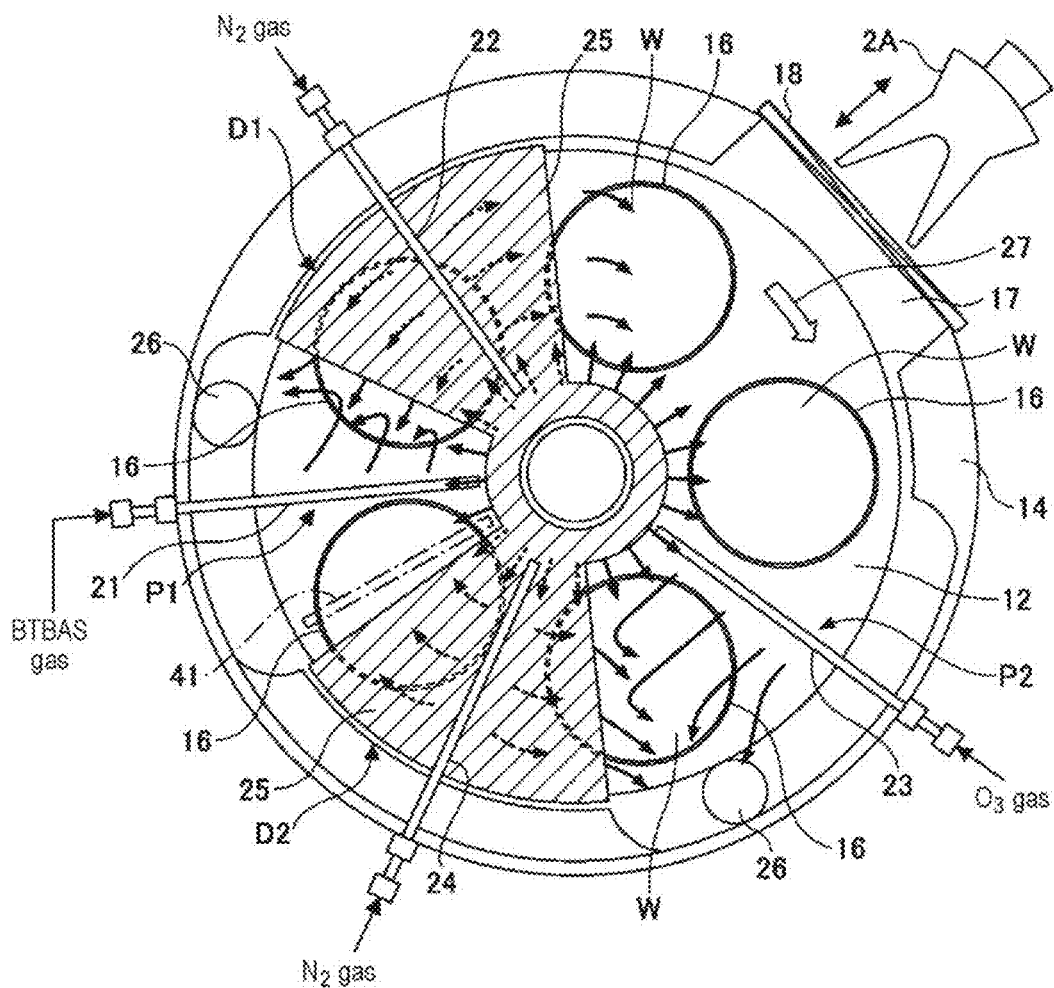

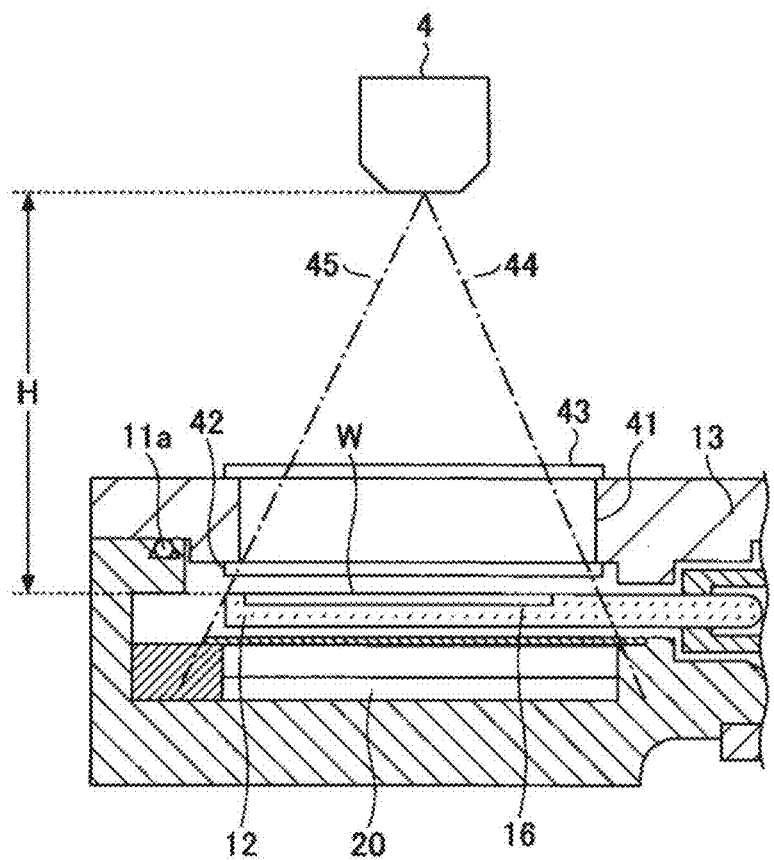

|  | Zone Za | Zone Zb | Zone Zc |
|---|---|---|---|
| Heater thermocouple | 420 | 390 | 420 |
| Radiation temperature measuring part | 400 | 400 | 400 |

HEAT TREATMENT APPARATUS AND TEMPERATURE CONTROL METHOD

CROSS-REFERENCE TO RELATED APPLICATION

This application claims the benefit of Japanese Patent Application No. 2015-130165, filed on Jun. 29, 2015, in the Japan Patent Office, the disclosure of which is incorporated herein in its entirety by reference.

TECHNICAL FIELD

The present disclosure relates to a heat treatment apparatus and a temperature control method.

BACKGROUND

A heat treatment apparatus in which semiconductor wafers (hereinafter, referred to as "wafers") as a plurality of substrates are mounted on a rotary table in a rotational direction of the rotary table installed inside a processing vessel has been used. This heat treatment apparatus includes a gas supply part installed in the diameter direction of the rotary table to supply a processing gas and a heater installed below the rotary table to heat the wafers. In addition, the rotary table is rotated in a state where the gas is discharged from the gas supply part and the wafers are heated by the heater, so that each of the wafers is subjected to a film forming process.

In such a heat treatment apparatus, for example, a temperature control is performed using, as a wafer temperature, a temperature measured by a thermocouple (TC for heater control) installed near the heater.

A semiconductor manufacturing apparatus has also been used in which a temperature of a susceptor having wafers mounted thereon is measured using a radiation thermometer in a film forming process, and an output of a heater is controlled based on the measurement result, thereby performing the film forming process on the wafers.

However, the apparatus fails to accurately measure a temperature of the wafer in the film forming process which is performed while rotating the rotary table. This makes it difficult to perform the film forming process on the wafer by controlling the wafer to have an appropriate temperature.

SUMMARY

In some embodiments of the present disclosure, a heat treatment apparatus includes a rotary table having substrates mounted thereon and rotating inside a processing vessel, and can accurately control temperatures of the substrates.

According to one embodiment of the present disclosure, there is provided a heat treatment apparatus for performing a predetermined film forming process on a substrate by mounting the substrate on a surface of a rotary table installed in a processing vessel and heating the substrate by a heating part while rotating the rotary table, the heat treatment apparatus including: a first temperature measuring part of a contact-type configured to measure a temperature of the heating part; a second temperature measuring part of a non-contact type configured to measure a temperature of the substrate mounted on the rotary table in a state where the rotary table is being rotated; and a temperature control part configured to control the heating part based on a first measurement value measured by the first temperature measuring part and a second measurement value measured by the second temperature measuring part.

According to another embodiment of the present disclosure, there is provided a temperature control method used in a heat treatment apparatus for performing a predetermined film forming process on a substrate by mounting the substrate on a surface of a rotary table installed inside a processing vessel and heating the substrate by a heating part while rotating the rotary table, the temperature control method including: mounting the substrate on the rotary table; measuring, by a first temperature measuring part of a contact-type, a temperature of the heating part; measuring, by a second temperature measuring part of a non-contact type, a temperature of the substrate mounted on the rotary table in a state where the rotary table is being rotated; and controlling the heating part based on a first measurement value measured by the first temperature measuring part and a second measurement value measured by the second temperature measuring part.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 3 is a schematic plan view of the heat treatment apparatus according to the embodiment of the present disclosure.

FIG. 4 is a partial cross sectional view illustrating a temperature measuring part in the heat treatment apparatus according to the embodiment of the present disclosure.

DETAILED DESCRIPTION

Figure 1:
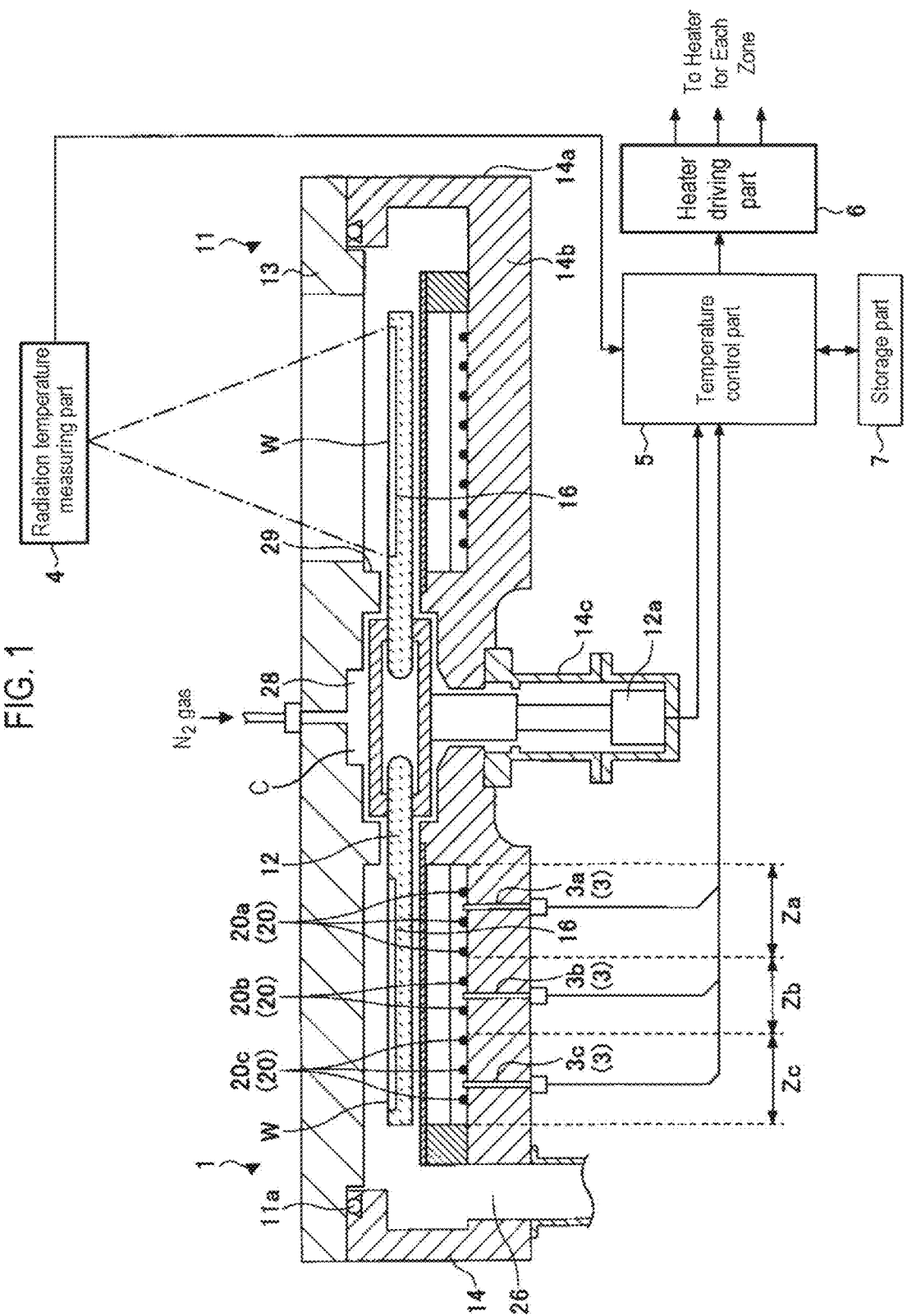
FIG. 1 is a schematic longitudinal cross sectional view of a heat treatment apparatus according to an embodiment of the present disclosure.

Reference will now be made in detail to various embodiments, examples of which are illustrated in the accompanying drawings. In the specification and drawings, like reference numerals will be assigned to like parts having substantially the same functions and duplicate descriptions thereof will be omitted. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

<Configuration of Heat Treatment Apparatus>

Figure 2:
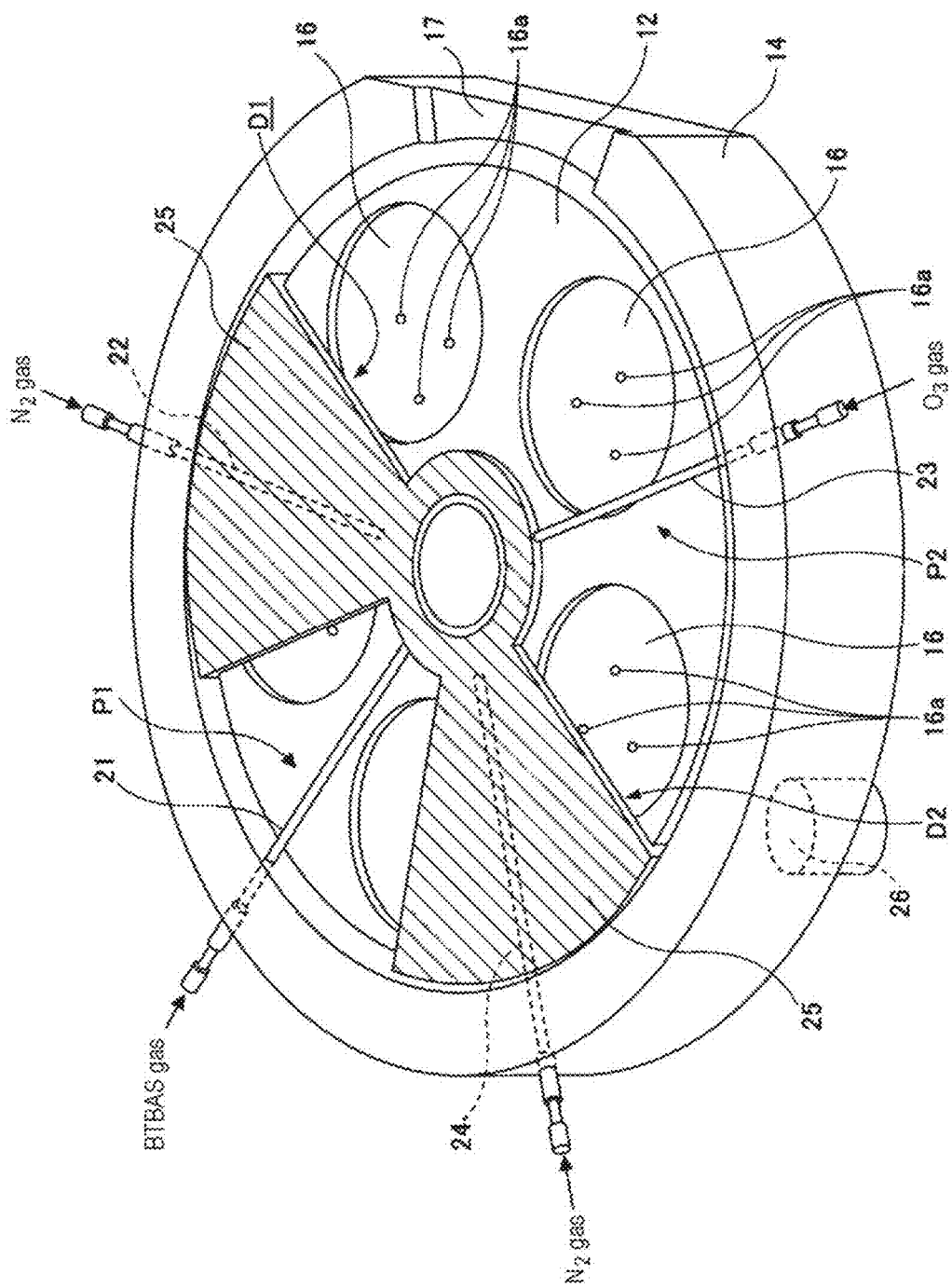
FIG. 2 is a schematic perspective view of the heat treatment apparatus according to the embodiment of the present disclosure.

An example of a heat treatment apparatus according to an embodiment of the present disclosure will now be described. FIG. 1 is a schematic longitudinal cross sectional view of the heat treatment apparatus according to this embodiment FIG. 2 is a schematic perspective view of the heat treatment apparatus according to the embodiment. FIG. 3 is a schematic plan view of the heat treatment apparatus according to the embodiment.

The heat treatment apparatus 1 of the embodiment includes a flat processing vessel 11 of a substantially circular shape and a disk-like rotary table 12 horizontally installed inside the processing vessel 11. The processing vessel 11 is installed in an atmospheric environment, and includes a ceiling plate 13 and a vessel main body 14 constituting a sidewall 14a and a bottom portion 14b of the processing vessel 11. In FIG. 1, a reference numeral 11a designates a sealing member for air-tightly maintaining the interior of the processing vessel 11, and a reference numeral 14c designates a cover for blocking a central portion of the vessel main body 14. In FIG. 1, a reference numeral 12a is a rotary drive mechanism which rotates the rotary table 12 in a circumferential direction. Also, the rotary drive mechanism 12a inputs a signal related to a rotational position or rotational speed of the rotary table 12 to a temperature control part 5 which will be described later.

Five concave portions 16 are formed in a surface of the rotary table 12 along a rotational direction of the rotary table 12. In FIG. 2, reference numeral 17 designates a transfer port. In FIG. 3, reference numeral 18 designates a shutter (not shown in FIG. 2) capable of opening/closing the transfer port 17. If a transfer mechanism 2A enters into the processing vessel 11 through the transfer port 17 while holding a wafer W, lifting pins (not shown) protrude upward from the rotary table 12 through holes 16a formed in the concave portion 16 at a position facing the transfer port 17 such that a wafer W is raised. In this way, the wafer W is transferred between the concave portion 16 and the transfer mechanism 2A.

A series of operations performed by the transfer mechanism 2A, the lifting pins, and the rotary table 12 is repeated, so that wafers W are transferred into the respective concave portions 16. Unloading of the wafer W from the processing vessel 11 is performed by raising the wafer W received in the concave portion 16 using the lifting pins, and picking up the wafer W by the transfer mechanism 2A.

A first reaction gas nozzle 21, a separation gas nozzle 22, a second reaction gas nozzle 23, and a separation gas nozzle 24, which extend in a rod shape toward the center from an outer periphery of the rotary table 12, are sequentially arranged above the rotary table 12 in a circumferential direction. Each of the gas nozzles 21 to 24 includes openings formed at a lower portion thereof to supply a gas along the diameter of the rotary table 12. The first reaction gas nozzle 21 discharges a BTBAS (bis-tertiary-butyl-amino-silane) gas and the second reaction gas nozzle 23 discharges an $O_3$ (ozone) gas, respectively. The separation gas nozzles 22 and 24 discharge an $N_2$ (nitrogen) gas, respectively.

The ceiling plate 13 of the processing vessel 11 includes two fan-like protruding portions 25 protruding downward. The protruding portions 25 are formed in a mutually spaced-apart relationship along the circumferential direction. Each of the separation gas nozzles 22 and 24 is installed to be embedded into the respective protruding portion 25 so that the respective protruding portion 25 is divided in the circumferential direction. The first reaction gas nozzle 21 and the second reaction gas nozzle 23 are installed to be spaced apart from each other in the respective protruding portions 25.

A heater 20 is installed under the rotary table 12. The heater 20 is an example of a heating part for heating the wafers W mounted on the rotary table 12. Specifically, the heater 20 is concentrically arranged around a rotational center P of the rotary table 12. An example of the heater 20 may include a resistance heater or an induction heater, such as a metal wire heater, a molybdenum heater or a carbon wire heater.

A heating region of the processing vessel 11 is partitioned into a plurality of (three in FIG. 1) zones Za, Zb, and Zc so as to control a temperature in the diameter direction of the rotary table 12. In addition, the heater 20 is configured by three zone heating heaters 20a, 20b and 20c which are divided corresponding to the respective zones Za, Zb, and Zc, so that the zone heating heaters 20a, 20b, and 20c can be individually controlled. The number of zones is not particularly limited, and may be one, two, or four or more.

Three heater thermocouples 3a, 3b, and 3c for measuring temperatures of the zone heating heaters 20a, 20b, and 20c are installed near the zone heating heaters 20a, 20b, and 20c, respectively. Hereinafter, the three heater thermocouples 3a, 3b, and 3c are sometimes simply referred to as a heater thermocouple 3.

The heater thermocouple 3 is an example of a contact-type first temperature measuring means for measuring a temperature of the heater 20. Specifically, one end of each of the heater thermocouples 3a, 3b, and 3c air-tightly penetrates through the bottom portion 14b of the vessel main body 14 from below the vessel main body 14 and is disposed under the rotary table 12. Meanwhile, the other end of each of the heater thermocouples 3a, 3b, and 3c is connected to the temperature control part 5 (to be described later). A measurement value (a first measurement value) obtained at each of the heater thermocouples 3a, 3b, and 3c is inputted to the temperature control pail 5 equipped with, e.g., a microcomputer or the like. In addition, based on the measurement values, the heating part s controlled and wafers W mounted on the rotary table 12 are heated.

If the wafers W are mounted in the respective concave portions 16, the interior of the processing vessel 11 is exhausted through exhaust port 26 which is formed outside the rotary table 12 in the diameter direction of the rotary table 12 from a region between separation regions D1 and D2 under the protruding portions 25 in the bottom of the vessel main body 14, so that the interior of the processing vessel 11 becomes a vacuum atmosphere. In addition, the rotary table 12 is rotated and simultaneously, the wafer W is heated to a predetermined temperature through the rotary table 12 by the heater 20 installed below the rotary table 12. In FIG. 3, an arrow 27 indicates a rotational direction of the rotary table 12.

Subsequently, gases are supplied from the respective gas nozzles 21 to 24, and the wafer W alternately passes through a first processing region P1 under the first reaction gas nozzle 21 and a second processing region P2 under the second reaction gas nozzle 23. Accordingly, the BTBAS gas is adsorbed onto the wafer W, and the $O_3$ gas is subsequently adsorbed onto the wafer W, so that BTBAS molecules are oxidized. Thus, a molecular layer of silicon oxide is formed in a single layer or plural layers. In this way, the molecular layers of silicon oxide are sequentially stacked, thereby forming a silicon oxide film having a predetermined film thickness.

The $N_2$ gas supplied to the separation regions D1 and D2 from the separation gas nozzles 22 and 24 in the film forming process spreads in the circumferential direction in the separation regions D1 and D2, to prevent the BTBAS gas and the $O_3$ gas from being mixed together on the rotary table 12. In addition, surplus BTBAS gas and $O_3$ gas are flowed into the exhaust ports 26. Furthermore, in the film forming process, the $N_2$ gas is supplied into a space 28 defined in a central region C of the rotary table 12. In the ceiling plate 13, the $N_2$ gas passes through below a ring-shaped protruding portion 29 formed to protrude downward and flows toward the outside in the diameter direction of the rotary table, thereby preventing the BTBAS gas and the $O_3$ gas from being mixed together in the central region C. In FIG. 3, flows of the respective gases in the film forming process are shown by arrows. Although not shown in this figure, the $N_2$ gas is also supplied into the cover 14c and onto a back side of the rotary table 12, so that the reaction gases are purged.

Next, the heat treatment apparatus 1 according to the embodiment will be described also with reference to FIG. 4 which shows an enlarged longitudinal cross section of the ceiling plate 13 and the rotary table 12. FIG. 4 is a partial cross sectional view illustrating the radiation temperature measuring part 4 in the heat treatment apparatus 1 according to this embodiment. Specifically, FIG. 4 shows across section between the processing region P1 in which the first reaction gas nozzle 21 is installed and the separation region D2 defined adjacent to an upstream side of the processing region P1 in the rotational direction of the rotary table 12.

In the ceiling plate 13, a slit 41 extending in the diameter direction of the rotary table 12 is formed at a position indicated by a dashed dotted line in FIG. 3. A lower window 42 and an upper window 43 are installed to respectively cover top and bottom portions of the slit 41. The lower window 42 and the upper window 43 are made of, for example, sapphire to allow infrared ray radiated from a front side of the rotary table 12 to transmit through the lower and upper windows 42 and 43. Thus, the radiation temperature measuring part 4 (to be described later) can measure a radiation temperature of the infrared ray. The term "front side" of the rotary table 12 used herein includes a front side of the wafer W.

The radiation temperature measuring part 4 is installed above the slit 41. The radiation temperature measuring part 4 is an example of a non-contact type second temperature measuring means that measures temperatures of wafers W mounted on the rotary table 12 while the rotary table 12 is rotated.

FIG. 4, the height H from the surface of the rotary table 12 to a bottom end of the radiation temperature measuring part 4 is, for example, 500 mm. The radiation temperature measuring part 4 induces the infrared ray radiated from a temperature measurement region of the rotary table 12 to a detection part 401 (to be described later) so that the detection part 401 acquires a measurement value (second measurement value) corresponding to an amount of the infrared ray. As such, the measurement value varies depending on a temperature of an acquirement place. The acquired measurement value is transmitted to the temperature control part 5 which will be described later.

Figure 5A:
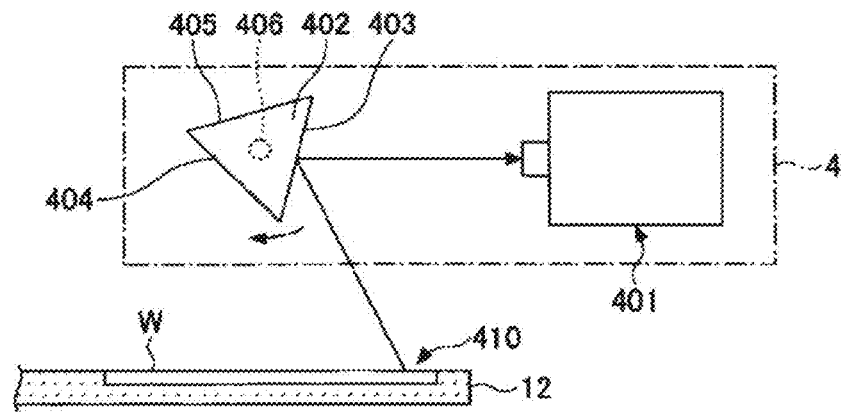
FIGS. 5A to 5C are views illustrating an operation of a radiation temperature measuring part.
Figure 5B:
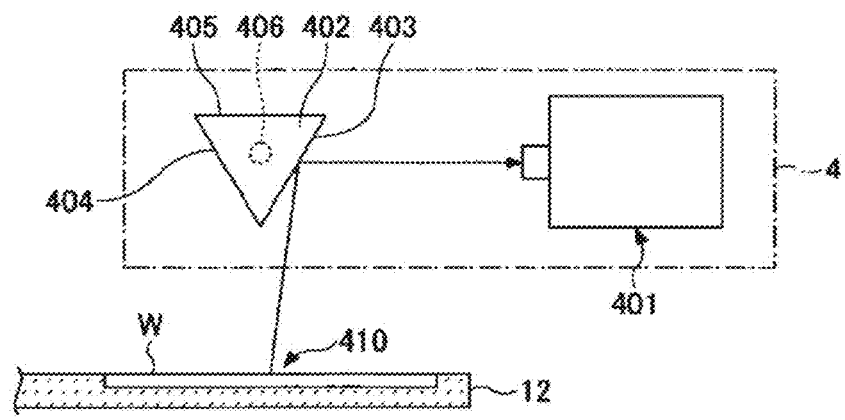
Figure 5C:
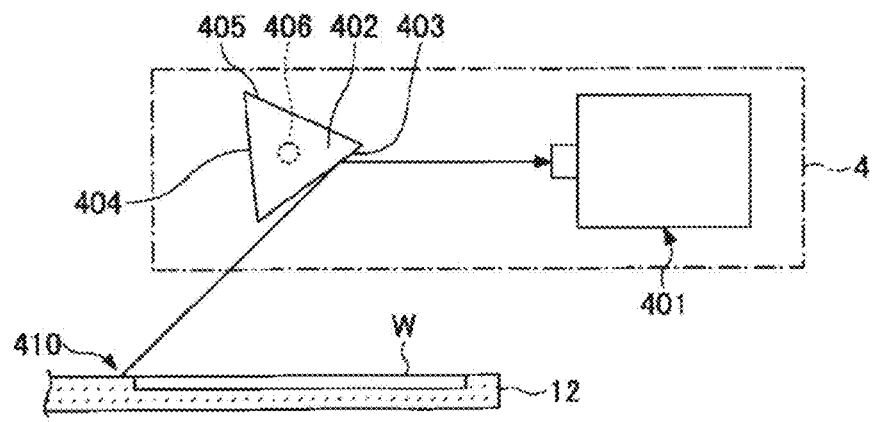

Next, an operation of the radiation temperature measuring part 4 will be described with reference to FIGS. 5A to 5C. FIGS. 5A to 5C are views illustrating an operation of the radiation temperature measuring part 4.

As shown in FIGS. 5A to 5C, the radiation temperature measuring part 4 includes a rotational body 402 equipped with a servomotor that rotates at 50 Hz. The rotational body 402 is configured in a triangular shape when viewed from the top. Three side surfaces of the rotational body 402 are defined as reflective surfaces 403 to 405. As shown in FIGS. 5A to 5C, as the rotational body 402 rotates around a rotating shaft 406, the infrared ray radiated from a temperature measurement region 410 in the rotary table 12 having the wafer W mounted thereon is reflected at any one of the reflective surfaces 403 to 405 as indicated by an arrow in FIGS. 5A to 5C. This reflected infrared ray is induced to the detection part 401. In addition, scanning is performed while moving a position of the temperature measurement region 410 in the diameter direction of the rotary table 12.

The detection part 401 is configured to continuously acquire the infrared ray a predetermined number of times (e.g., 128 times) from the respective reflective surface, to detect temperatures at predetermined places e.g., 128 places) in the diameter direction of the rotary table 12. In addition, the reflective surfaces 403 to 405 are sequentially located on an optical path of the infrared ray with the rotation of the rotational body 402, so that the scanning can be repeatedly performed toward the outside from the inside of the rotary table 12. Here, the speed of the scanning is 150 Hz. That is to say, the radiation temperature measuring part 4 can perform the scanning 150 times for one second. The temperature measurement region 410 is a spot having a diameter of 5 mm. The scanning is performed in a section ranging from inward of the concave portion 16 into which the wafer W is mounted in the rotary table 12 to an outer peripheral end of the rotary table 12. In FIG. 4, dashed dotted lines 44 and 45 indicate paths of the infrared ray that orients to the radiation temperature measuring part 4 from the temperature measurement regions 410 when the temperature measurement regions 410 moves to the innermost and outermost peripheral sides of the rotary table 12.

Figures 6, 7:
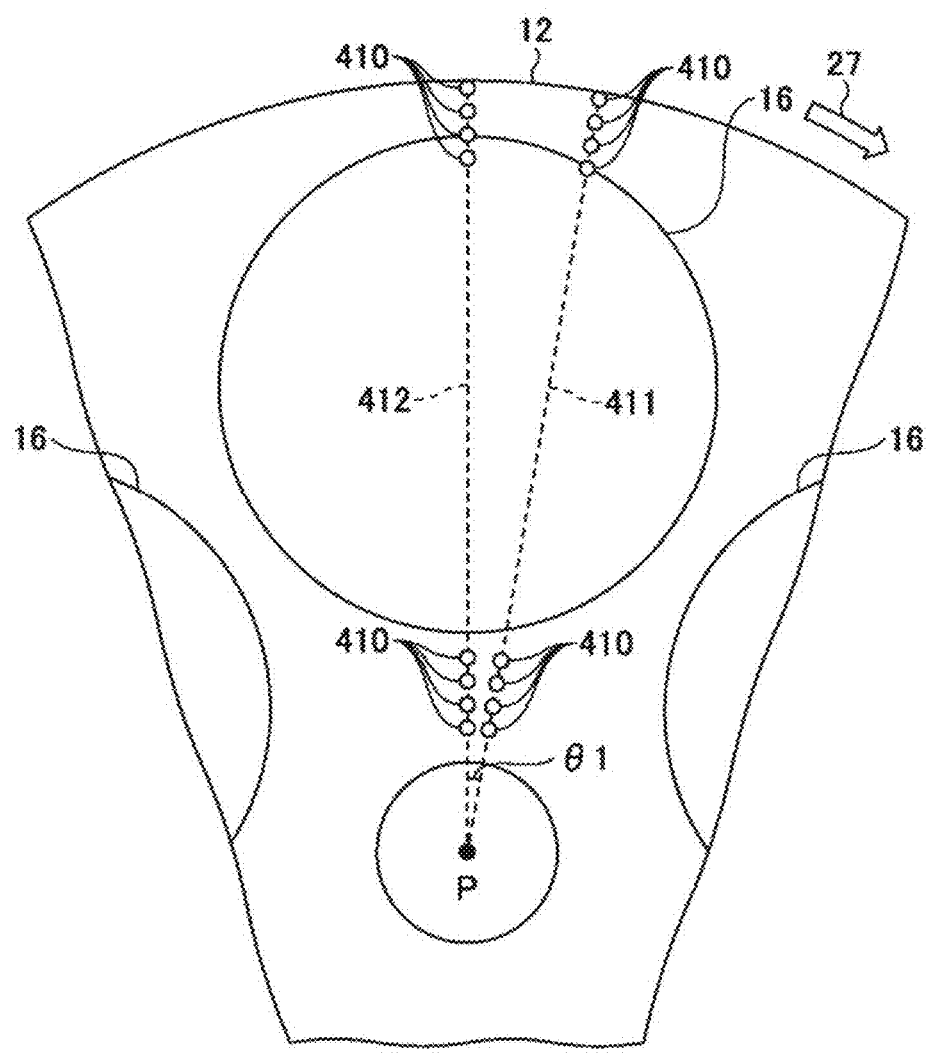
FIG. 6 is a view illustrating a relationship between a rotary table and a temperature measurement region.
FIG. 7 is a table illustrating a correlation between a heater thermocouple and the radiation temperature measuring part.

The scanning by the radiation temperature measuring part 4 is performed in a state where the rotary table 12 is rotated. The rotational speed of the rotary table 12 is 240 rpm in this embodiment FIG. 6 is a plan view illustrating a relationship between the rotary table 12 and the temperature measurement region 410. In FIG. 6, reference numeral 411 designates a row (scan line) of the temperature measurement region 410 when an nth (n is an integer) scanning is performed outward from inward of the rotary table 12 in a state where the rotary table 12 is rotated. In FIG. 6, reference numeral 412 designates a scan line when an (n+1)th (n is an integer) scanning is performed. With the rotation of the rotary table 12, a central angle between the scan lines 411 and 412 with respect to the rotational center P of the rotary table 12 is offset by an angle θ1 corresponding to the rotational speed of the rotary table 12. By repeating the scanning while rotating the rotary table 12 as described above, measurement values at a plurality of positions on the rotary table 12 are sequentially acquired.

The temperature control part 5 controls a heater driving part 6 to control the temperature of the wafer W, based on the measurement values measured by the heater thermocouple 3 and the measurement values measured by the radiation temperature measuring part 4. In addition, signals related to the rotational position and the rotational speed of the rotary table 12 are inputted to the temperature control part 5 from the rotary drive mechanism 12a.

In FIG. 1, a storage part 7 is a memory storing a table or the like, which will be described later.

<Temperature Control Method>

Next, an example of a temperature control method performed using the aforementioned heat treatment apparatus 1 of the embodiment will be described.

First, a film forming process performed on a product wafer using the heat treatment apparatus 1 will be described.

The shutter 18 installed in the transfer port 17 is opened, and the product wafer is transferred into the concave portion 16 of the rotary table 12 from outside of the processing vessel 11 through the transfer port 17 by the transfer mechanism 2A. Such a transfer operation is performed by raising and lowering the lifting pins (not shown) through through-holes formed in the bottom surface of the concave portion 16 from a lower portion of the processing vessel 11 when the concave portion 16 is positioned at a position facing the transfer port 17. The transfer operation of the product wafer is performed by intermittently rotating the rotary table 12, so that product wafers are mounted in the five concave portions 16 of the rotary table 12, respectively.

Subsequently, the shutter 18 is closed and the interior of the processing vessel 11 is vacuumed by a vacuum pump (no(shown) connected to the exhaust port 26. The $N_2$ gas as the separation gas is discharged from the separation gas nozzles 22 and 24 at a predetermined flow rate and supplied into the space 28 in the central region C of the rotary table 12 at the predetermined flow rate. Thus, an internal pressure of the processing vessel 11 is adjusted to a preset pressure by a pressure adjustment part (not shown) connected to the exhaust port 26.

Thereafter, the product wafers are heated to, for example, 400 degrees C., by the heater 20 while rotating the rotary table 12 clockwise. The BTBAS gas is supplied from the first reaction gas nozzle 21, and the $O_3$ gas is supplied from the second reaction gas nozzle 23.

When the product wafer passes through the first processing region P1, the BTBAS gas as a raw material gas is supplied from the first reaction gas nozzle 21 to be adsorbed onto a surface of the product wafer. The product wafer having the BTBAS gas adsorbed onto the surface thereof is purged by passing through the separation region D1 in which the separation gas nozzle 22 is installed, with the rotation of the rotary table 12, and subsequently, enters into the second processing region P2.

In the second processing region P2, the $O_3$ gas is supplied from the second reaction gas nozzle 23, so that a Si component contained in the BTBAS gas is oxidized by the $O_3$ gas. Thus, an $SiO_2$ as a reaction product is deposited on the surface of the product wafer. The product wafer passed through the second processing region P2 is purged by passing through the separation region D2 in which the separation gas nozzle 24 is installed, and subsequently, re-enters into the first processing region P1.

Further, the BTBAS gas is supplied from the first reaction gas nozzle 21 to be adsorbed onto the surface of the product wafer.

In this way, by continuously rotating the rotary table 12 a plurality of times, the BTBAS gas and the $O_3$ gas are supplied into the processing vessel 11. Thus, the $SiO_2$ as the reaction product is deposited on the surface of the product wafer, thereby forming a $SiO_2$ film (silicon oxide film).

Here, during the film forming process for the product wafer, temperatures of the zone heating heaters 20a, 20b, and 20c are measured by the heater thermocouples 3a, 3b, and 3c corresponding to the zones Za, Zb, and Zc, respectively. The measurement values are inputted to the temperature control part 5. In addition, the temperature control part 5 drives the heater driving part 6 to control each of the zone heating heaters 20a, 20b, and 20c, based on the measured measurement values and the table stored in the medium 7 which will be described later.

The film forming process for the product wafer is performed as described above. In this embodiment, prior to the aforementioned film forming process for the product wafer, a correlation between the measurement values measured by the heater thermocouple 3 and the measurement values measured by the radiation temperature measuring part 4 is tabulated using a dummy wafer (e.g., a SiC wafer). In the film forming process for the product wafer, the temperature control is performed with reference to the table.

First, by the same method as the film forming process for the product wafer, dummy wafers are mounted in the five concave portions 16 of the rotary table 12, respectively, and subsequently, the internal pressure of the processing vessel 11 is adjusted to a preset pressure. Thereafter, the dummy wafers are heated to, for example, 400 degrees C., by the heater 20 while rotating the rotary table 12 clockwise.

Subsequently, the temperatures of the zone heating heaters 20a, 20b, and 20c are measured by the respective heater thermocouples 3a, 3b, and 3c, and the temperatures of the dummy wafers are measured by the radiation temperature measuring part 4. In addition, a correlation between the measurement values measured by the heater thermocouples 3a, 3b, and 3c and the measurement values measured by the radiation temperature measuring part 4 is tabulated by the temperature control part 5. In some embodiments, the temperatures of the respective heater thermocouples 3a, 3b, and 3c when the measurement value of the radiation temperature measuring part 4 becomes a temperature used in the film forming process may be tabulated us shown in FIG. 7. FIG. 7 is a table illustrating a correlation between the heater thermocouples 3a, 3b, and 3c and the radiation temperature measuring part 4.

Processing conditions applied when creating the table may be set equally to those in the film forming process for the product wafer. Also, in a case where a plurality of temperature conditions is applied in the film forming process for the product wafer, a plurality of tables may be prepared in advance by changing the temperatures measured by the radiation temperature measuring part 4 to meet the plurality of temperature conditions in the film forming process for the product water. Accordingly, even if the plurality of temperature conditions is applied in the film forming process for the product wafer, the heating part can be controlled with reference to the respective table corresponding to the temperature conditions in the film forming process for the product wafer, which makes it possible to accurately control a temperature of a substrate.

Also, even if temperature conditions in the film forming process for the product wafer are not determined or even if the temperature conditions are likely to be changed, a plurality of tables listed up at a predetermined interval of temperature (e.g., 10 degrees C.) may be prepared in advance such that the temperature of the substrate can be accurately controlled. Thus, even if any temperature conditions in the film forming process for the product wafer are not determined or even if such temperature conditions have been changed, the heating part can be controlled with reference to the temperature conditions in the film forming process for the product wafer or a respective table close to the temperature conditions in the film forming process for the product wafer. This makes it possible to accurately control the temperature of the substrate.

Meanwhile, the temperature measurement by the radiation temperature measuring part 4 is performed while rotating the rotary table 12. As such, a temperature (e.g., a temperature of the rotary table 12) other than the temperature of the dummy wafer is sometimes included in the measurement value.

Therefore, it is preferably for the temperature control part 5 to determine whether the measurement value measured by the radiation temperature measuring part 4 to be inputted to the temperature control part 5 is the temperature of the dummy wafer.

The determination method performed by the temperature control part 5 is not particularly limited. As an example, the temperature control part 5 determines whether the measurement value inputted from the radiation temperature measuring part 4 is the temperature of the dummy wafer, based on signals related to a rotational position and a rotational speed of the rotary table 12, which are inputted from the rotary drive mechanism 12a. Specifically, the determination is performed by comparing information on preset rotational positions of the five concave portions 16 of the rotary table 12 with information on the rotational position and the rotational speed of the rotary table 12.

Upon completing the creation of the table in this way, the aforementioned film forming process for the product wafers is performed. The film forming process for the product wafers is repeated, for example, until maintenance work such as exchange of parts of the heat treatment apparatus 1 is needed. After the maintenance work of the heat treatment apparatus 1 is performed, the creation of a table is resumed. A timing at which the creation of the table is performed is not limited to after the maintenance work of the heat treatment apparatus. In some embodiments, the creation of the table may be performed at another timing, for example, after a cleaning process is performed, and the like.

Next, a temperature of the wafer W mounted on the rotary table 12 will be described.

Figure 8A:
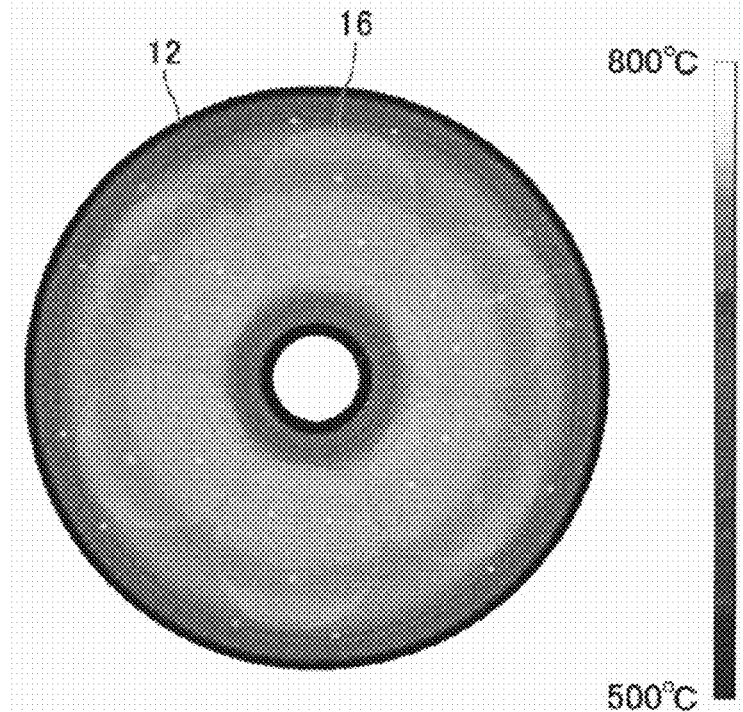
FIGS. 8A and 8B are views illustrating temperature distributions of a wafer in states where the rotary table is being rotated and the rotary table is not being rotated.
Figure 8B:
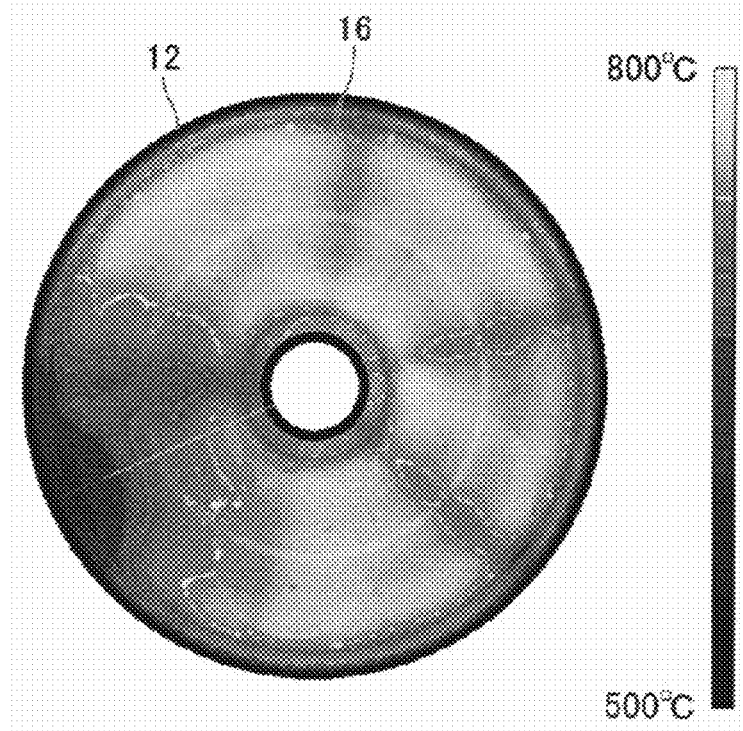

First, examples of temperature distributions of the wafers W (the rotary table 12) in a state where the rotary table 12 is being rotated and in a state where the rotary table 12 is not being rotated will be described. FIGS. 8A and 8B are views illustrating temperature distributions of the wafer in the state where the rotary table 12 is being rotated and in the state where the rotary table 12 is not being rotated. Specifically, FIG. 8A shows a temperature distribution of the wafer W (the rotary table 12) when the heater 20 is controlled such that the temperature of the wafer W becomes 760 degrees C. in the state where the rotary table 12 is being rotated. FIG. 8B shows a temperature distribution of the wafer W (the rotary table 12) when the heater 20 is controlled such that the temperature of the wafer W becomes 760 degrees C. in the state where the rotary table 12 is not being rotated.

As shown in FIGS. 8A and 8B, it can be seen that the temperature distribution of the wafer W (the rotary table 12) in the state where the rotary table 12 is being rotated is considerably different from that in the state where the rotary table 12 is not being rotated. From this, it can be known that it is important to accurately measure a temperature of a wafer in a film forming process performed in the state where the rotary table 12 is being rotated.

Next, temperatures of the wafers W when the heater 20 is controlled by the aforementioned temperature control method will be described.

Figure 9:
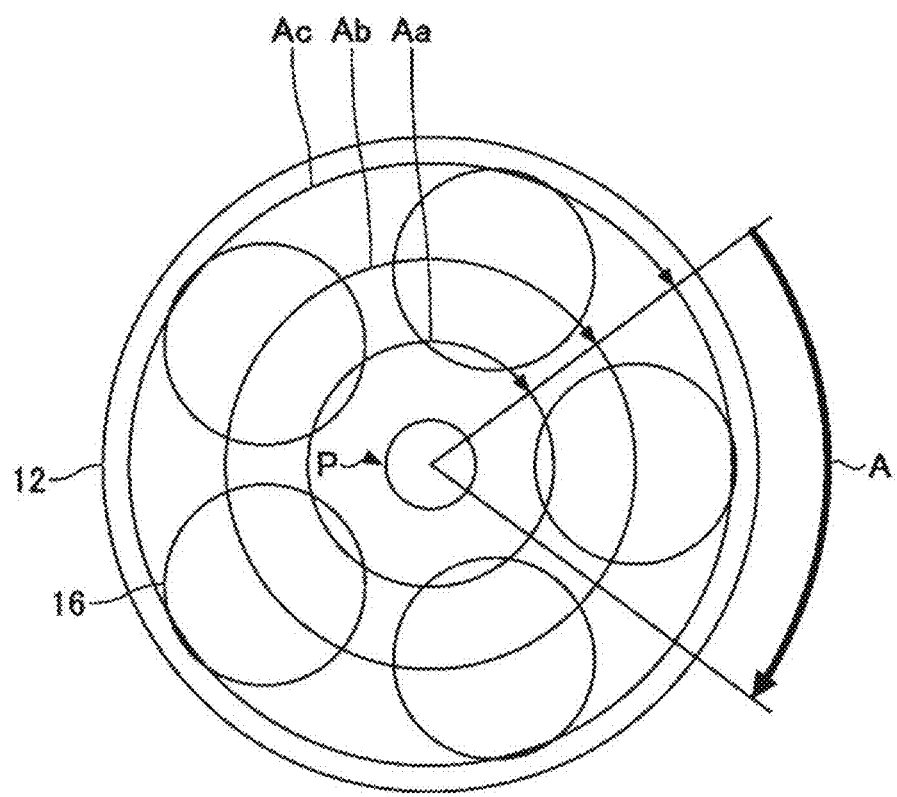
FIG. 9 is a view illustrating positions of wafers mounted on the rotary table.
Figure 10A:
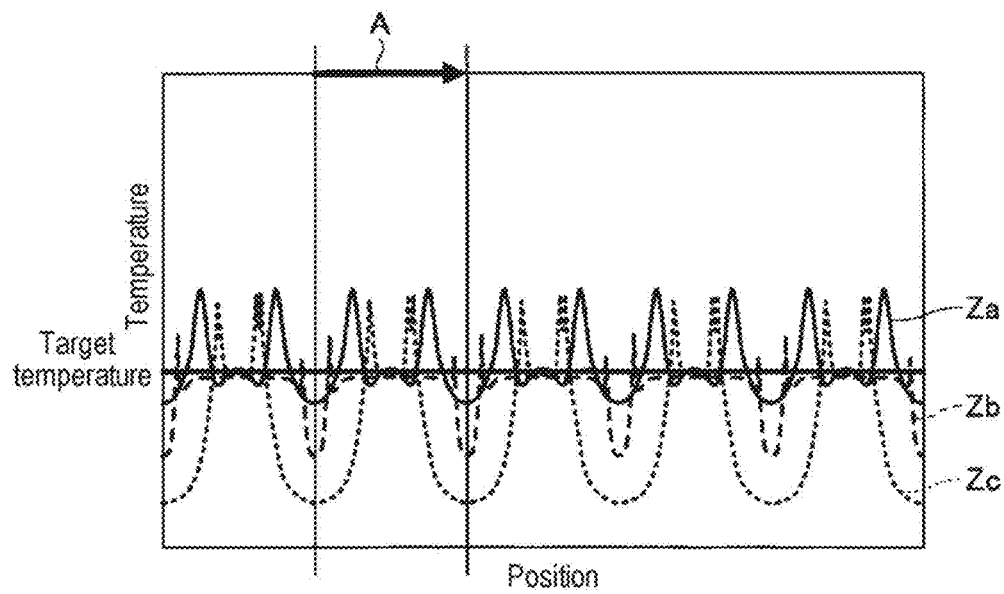
FIGS. 10A and 10B are views illustrating effects of the heat treatment apparatus according to the embodiment of the present disclosure.
Figure 10B:
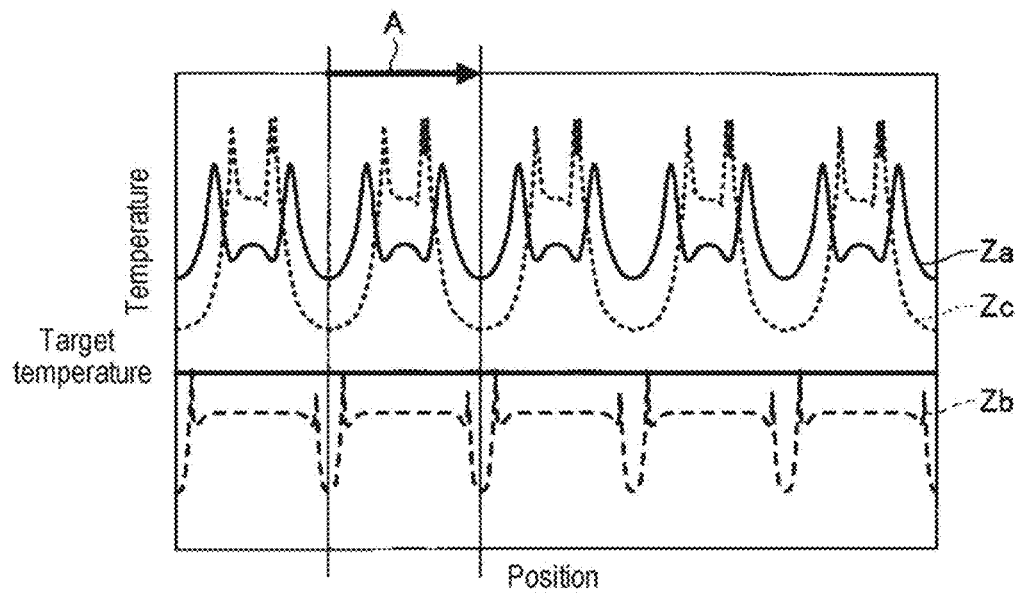

FIG. 9 is a view illustrating positions of the wafers W mounted on the rotary table 12. FIGS. 10A and 10B are views illustrating an effect of the heat treatment apparatus 1 according to the embodiment of the present disclosure.

Specifically, FIGS. 10A and 10B are graphs showing results obtained by measuring, by the radiation temperature measuring part 4, temperatures of the wafer W (the rotary table 12) when rotating the rotary table 12 clockwise by 360 degrees along an arrow A in FIG. 9. FIG. 10A is a graph when the heater 20 is controlled by the aforementioned temperature control method, and FIG. 10B is a graph when the heater 20 is not controlled by the aforementioned temperature control method. In each of FIGS. 10A and 10B, a horizontal axis represents a position and a vertical axis represents a temperature.

In each of FIGS. 10A and 10B, a solid line, a dashed line, and a dotted line represent temperatures of the wafer W (the rotary table 12) in the zone Za (indicated by an arrow Aa), the zone Zb (indicated by an arrow Ab), and the zone Zc (indicated by an arrow Ac) when rotating the rotary table 12 along the arrow A of FIG. 9, respectively. As shown in FIGS. 10A and 10B, the temperature in each of the zones Za, Zb, and Zc ripples. This is because the wafer W and the rotary table 12 are alternately measured.

As shown in FIG. 10A, it can be seen that when the heater 20 is controlled by the aforementioned temperature control method, the temperatures of the wafer W in all of the zones Za, Zb, and Zc are the same as a target temperature (a temperature in the film forming process).

On the other hand, as shown in FIG. 10B, it can be seen that when the heater 20 is controlled without having to use the aforementioned temperature control method (without having to use the aforementioned table), the temperatures of the wafer W in all of the zones Za, Zb, and Zc are considerably deviated from the target temperature. Specifically, the temperatures of the wafer W in the zones Za and Zc are higher than the target temperature, and the temperature of the wafer W in the zone Zb is lower than the target temperature. Therefore, it can be seen that a variation in the temperature of the water W in the diameter direction of the rotary table 12 increases.

As described above, according to the heat treatment apparatus and the temperature control method of the embodiment, the temperature of the wafer W is measured by the radiation temperature measuring part 4. This makes it possible to measure the temperature of the wafer W with a high degree of accuracy. Furthermore, the temperature of the heater 20 is measured by the heater thermocouple 3 and the temperature control part 5 controls the heater 20 based on the temperatures measured by the heater thermocouple 3 and the temperature measured by the radiation temperature measuring part 4 so that the temperature of the wafer W is controlled. It is therefore possible to accurately measure the temperature of the wafer W.

Although in the above embodiments, the heat treatment apparatus and the temperature control method have been described, the present disclosure is not limited thereto and various changes and modifications may be made within the scope of the present disclosure.

Although in the above embodiments, the radiation temperature measuring part 4 has been described to be used as the second temperature measuring means, the present disclosure is not limited thereto. A non-contact type temperature measuring means may be used as the second temperature measurement means. As an example, a radiation thermometer or a wireless temperature sensor using surface acoustic waves may be used as the second temperature measurement means.

According to the present disclosure in some embodiments, it is possible to provide a heat treatment apparatus which includes a rotary table having substrates mounted thereon and rotating inside a processing vessel, and can accurately control temperatures of the substrates.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus for performing a predetermined film forming process on a substrate by mounting a set of a plurality of substrates on a surface of a rotary table installed in a processing vessel and heating the plurality of substrates by a heating part while rotating the rotary table, the heat treatment apparatus comprising:
   a contact type thermocouple configured to measure a temperature of the heating part;
   a non-contact type radiation temperature measuring part configured to measure a temperature of the substrate mounted on the rotary table in a state where the rotary table is being rotated; and
   a temperature controller configured to control the thermocouple and the radiation temperature measuring part to perform a process including:
      prior to performing the predetermined film forming process, mounting a set of a plurality of dummy substrates on the rotary table, tabulating a correlation between a first measurement value measured by the thermocouple and a second measurement value measured by the radiation temperature measuring part using the set of the plurality of dummy substrates, and storing the tabulated correlation into a storage part;
      determining whether the second measurement value is the temperature of the dummy substrates; and
      after storing the tabulated correlation, performing the predetermined film forming process on additional sets of the plurality of substrates while controlling the heating part based on the correlation stored in the storage part,
   wherein the thermocouple and the radiation temperature measuring part measure temperatures in a plurality of regions defined along a diameter direction of the rotary table.

2. The heat treatment apparatus of claim 1, wherein the temperature controller controls the heating part such that the temperature measured by the radiation temperature measuring part meets a temperature condition applied when performing the predetermined film forming process, and subsequently, tabulates the correlation between the first measurement value and the second measurement value, and stores the tabulated correlation into the storage part.

3. The heat treatment apparatus of claim 1, wherein the temperature controller changes the temperature measured by the radiation temperature measuring part to meet a plurality of temperature conditions applied when performing the predetermined film forming process, tabulates the correlation between the first measurement value and the second measurement value under each of the plurality of temperature conditions, and stores the tabulated correlation into the storage part.

4. The heat treatment apparatus of claim 1, wherein the radiation temperature measuring part detects an infrared ray radiated from a surface of the substrate to measure the temperature of the substrate.

* * * * *